(12) United States Patent
Charles

(10) Patent No.: US 6,335,559 B1
(45) Date of Patent: Jan. 1, 2002

(54) SEMICONDUCTOR DEVICE CLEAVE INITIATION

(75) Inventor: Paul Marshall Charles, Bramford (GB)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/349,253

(22) Filed: Jul. 8, 1999

(30) Foreign Application Priority Data

Jul. 8, 1998 (EP) .............................. 98305435

(51) Int. Cl.⁷ ................................................ H01L 23/48
(52) U.S. Cl. .......................... 257/620; 257/622; 257/623
(58) Field of Search .............................. 438/33, 26, 113, 438/462; 257/618, 622, 623, 619, 634, 797, 620

(56) References Cited

U.S. PATENT DOCUMENTS

| | | | | |
|---|---|---|---|---|
| 4,236,296 A | * | 12/1980 | Woolhouse et al. | 29/569 L |
| 4,237,601 A | | 12/1980 | Woolhouse et al. | |
| 4,883,771 A | * | 11/1989 | Kumabe et al. | 437/129 |
| 5,171,717 A | * | 12/1992 | Broom et al. | 437/226 |
| 5,259,925 A | * | 11/1993 | Herrick et al. | 156/659 |
| 5,314,844 A | * | 5/1994 | Imamura | 437/226 |
| 5,418,190 A | | 5/1995 | Cholewa et al. | |
| 5,629,233 A | | 5/1997 | Chand et al. | |
| 5,693,181 A | * | 12/1997 | Berntein | 156/644.1 |
| 5,780,320 A | * | 7/1998 | Kinoshita | 438/33 |
| 5,904,548 A | * | 5/1999 | Orcutt | 438/462 |
| 5,976,904 A | * | 11/1999 | Gotoh et al. | 438/33 |
| 6,040,597 A | * | 3/2000 | Kim et al. | 257/321 |
| 6,048,747 A | * | 4/2000 | Chakrabarti et al. | 438/33 |
| 6,100,576 A | * | 8/2000 | Backlund | 257/622 |

FOREIGN PATENT DOCUMENTS

| | | |
|---|---|---|
| DE | 3731312 A1 | 3/1989 |
| EP | 0 108 475 A2 | 5/1984 |
| EP | 0 573 724 A1 | 12/1993 |
| JP | 56 071989 A | 6/1981 |
| JP | 08 125279 A | 5/1996 |

* cited by examiner

*Primary Examiner*—Eddie Lee
*Assistant Examiner*—Lourdes Cruz

(57) ABSTRACT

The present invention relates to a method of etching a semiconductor wafer (100), particularly of a compound semiconductor, in order to facilitate cleaving of devices (200) from the wafer (100), and to devices (200) cleaved by such a method. A semiconductor device (200) is cleaved from a wafer (100) and comprises a substrate (106) and grown upon the substrate (106) one or more layers (108, 110, 112, 116, 122), the cleaves (150, 151, 153, 154) thereby defining two pairs of parallel edges (201, 202; 203; 204) of the device (200). Each of the cleaves is guided by a groove (163, 164; 166, 266) etched through the grown layers (108, 110, 112, 116, 122) and partly into the substrate (106).

36 Claims, 4 Drawing Sheets

SEMICONDUCTOR DEVICE CLEAVE INITIATION

FIELD OF THE INVENTION

The present invention relates to a method of etching a semiconductor wafer, particularly of a compound semiconductor, in order to facilitate cleaving of devices from the wafer, and to devices cleaved by such a method.

BACKGROUND ART

Semiconductor wafers are conventionally cleaved by inscribing or scoring with a diamond tipped stylus, marks or lines into the surface of the wafer. The inscribing is done after the processing of the devices, usually by placing the device on an adhesive mat. After inscribing a number of lines in one direction, the wafer is struck to separate the wafer into bars. With the bars still held in place, the wafer is then rotated through 90° and inscribed again, before being struck again to separate each device from each bar. The semiconductor device is then subjected to further processing, for example for incorporation into a chip or other package.

The scribing process suffers from a number of limitations. First, scoring of the surface is inherently a destructive process, and causes minute cracks and other imperfections along the length and radiating from the ends of the line. Such imperfections cause irregularities in the cleave planes, and variability of dimensions between devices. Furthermore, debris from the inscribing process can interfere mechanically, electrically or optically with the finished device, and must be washed off the cleaved bars or devices prior to any soldering to a mount or heat sink and bonding to wires. Washing carries the risk of inadvertent contamination of the external surfaces of the devices. These effects are a particular problem with compound semiconductor devices, such as edge emitting laser diodes, light emitting diodes and detectors.

The irregular damage caused during inscribing can be reduced if stylus speed is kept low. In practice, however low stylus speed is a significant inconvenience. For example, a compound semiconductor wafer 32 mm square takes between three and four hours to inscribe, cleave and wash, using an inscribing machine that costs about $70,000.

The inscribing process typically cuts about 2 $\mu$m into the top surface of a device. In many optical devices, the active optical layer, for example the stripe in a gain guided semiconductor laser, is at a depth less than this. Since imperfections in a cleave plane across an optical facet must be avoided, it is not possible to scribe across the width of the wafer in one direction. Therefore, it is conventional for short nicks to be inscribed along opposite edges of the wafer at intervals equal to the length of a semiconductor optical device. Splitting the wafer into bars is then initiated from aligned pairs of these nicks. If all is well the cleave propagates across the wafer to the opposite edge. This avoids imperfections in the facet, but unfortunately, micro-cracks from the ends of the nicks cause variability in the width of the bars and hence length of the devices. (In the transverse direction, the inscription can be across the full width of the bars, causing lower dimensional variation.)

For example, in devices formed from bars 350 $\mu$m long, an acceptable variability in the length of the device may be ±10 $\mu$m. If a pair of adjacent cracks defining the length of a bar both deviate significantly in opposite directions, the width of the bar is outside this specification, resulting in rejection of every device cleaved from the bar, and most likely the adjacent bar. Since each bar contains about 150 devices, such a fault likely results in the rejection of 300 devices.

The fact that the nicks do not extend across the wafer also carries the risk that a crack will not propagate fully across the wafer or that the wafer will break up irregularly when struck. These factors, and contamination due to debris or the wash, can have a serious effect on the yield of the process used to form the semiconductor devices.

Patent document JP 2039481 A proposes the use of V-shaped grooves etched in a region 1 to 3 mm from the edge of a wafer, as an aid to cleave initiation. The V-grooves need to be etched either directly into the bare substrate prior to formation of all the overlying layers, or prior to the final formation of laser stripes and contacts. The V-grooves cannot extend across the full width of the wafer because these would interfere with the laser stripe, and it is still necessary to cleave the wafer in one direction by the conventional scribing and striking method.

It is an object of the invention to provide a semiconductor manufacturing process and a device from such a process, that addresses some of these problems.

SUMMARY OF THE INVENTION

One aspect of the invention provides a semiconductor device cleaved from a wafer comprising a substrate and grown upon the substrate one or more layers, the cleaves thereby defining two pairs of parallel edges of the device, characterised in that each of the cleaves has been guided by a groove etched through the grown layers and partly into the substrate.

Also according to another aspect of the invention, there is provided a semiconductor wafer comprising a substrate and grown upon the substrate one or more layers, and grooves etched through the grown layers and partly into the substrate, characterised in that the grooves are arranged in a grid-like pattern to define cleave planes and hence edges of an array of semiconductor devices.

The semiconductor device may be a compound semiconductor device. The layers grown on the substrate will in general comprise semiconductor, insulating or conducting layers defining the electrical and/or optical properties of the device.

The pairs of edges will in general be orthogonal pairs defining the edges of a square or rectangular semiconductor device.

The groove may have a wall that extends at least partly along an edge of the device, or the groove may extend fully along an edge of the device.

In a preferred embodiment, a first pair of parallel edges is at right angles to a second pair of parallel edges, in which each one of the first pair of edges has a groove wall extending fully therealong, and each one of the second pair of edges has a groove wall extending only partly therealong.

Then, if the device has an active optical region within the grown layers, with the optical region extending to an edge of the device, that portion of the edge may have no such groove wall, so that the portion of the edge of the device having the active optical region is defined by a cleave plane.

Because etch rates for a groove can depend upon the crystal orientation of the material, it is advantageous if two adjacent edges each have a groove wall that extends at least partly along an edge of the device, with at least one of the groove walls not extending to a corner defined by the junction of the adjacent edges. In this way, preferential etching at a corner between adjacent groove walls can be avoided.

The invention also provides a manufacturing process for a semiconductor wafer, comprising the steps of:

i) forming a semiconductor substrate;
ii) growing upon the substrate one or more layers;
iii) etching grooves through the grown layers and partly into the substrate, characterised in that the grooves are arranged in a grid-like pattern to define cleave planes and hence edges of an array of semiconductor devices.

Once the wafer has been formed, the semiconductor device may be formed by cleaving the wafer along the grid-like pattern of grooves to separate the devices.

BRIEF DESCRIPTION OF THE DRAWINGS

The invention will now be described, by way of example, with reference to the accompanying drawings, in which.

DETAILED DESCRIPTION OF THE DRAWINGS

Figure 1:
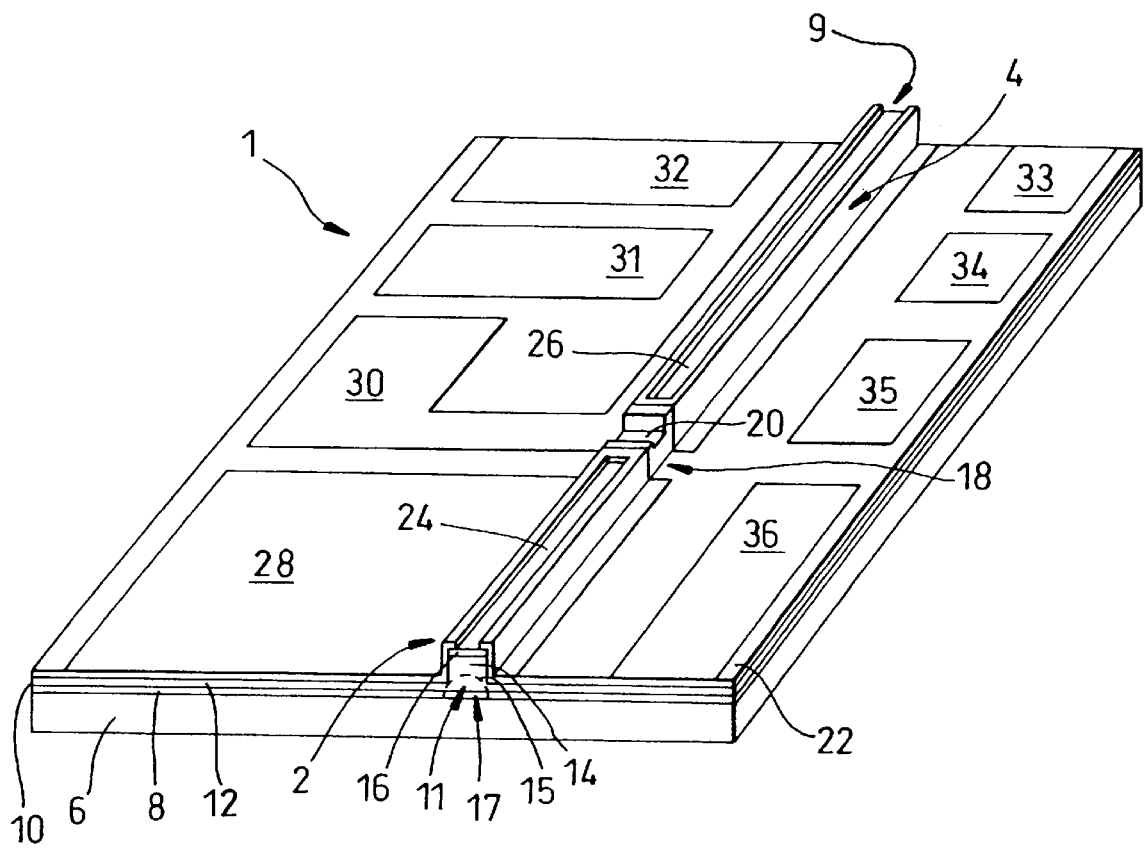
FIG. 1 is a schematic perspective view of a prior art integrated opto-electronic device after cleaving from a wafer, comprising a mesa ridge stripe comprising distributed feed-back laser diode in line with an electro-absorption modulator.
Figure 2:
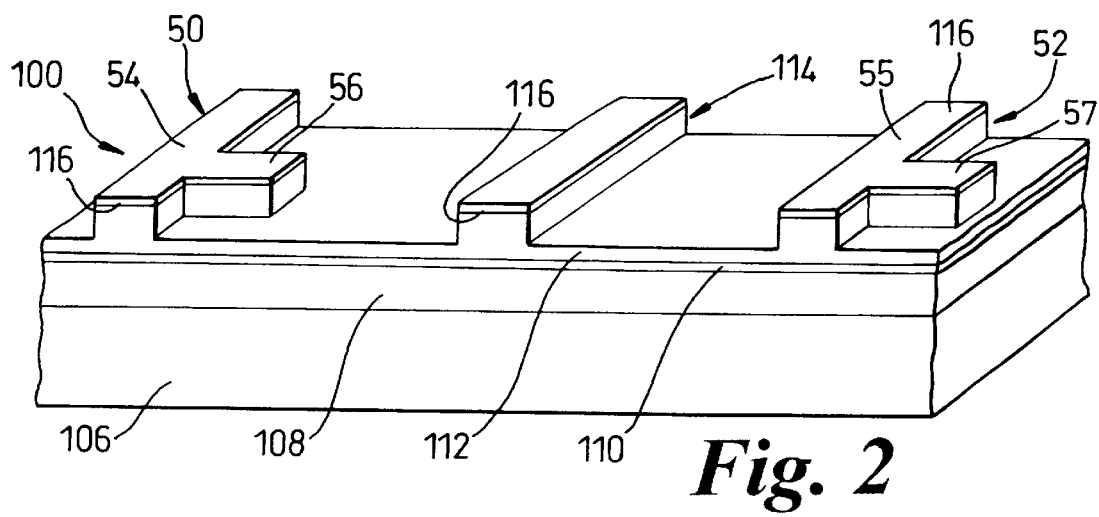
FIGS. 2 to 4 are schematic perspective views of stages in the formation of part of a wafer according to the invention and prior to cleaving of semiconductor devices from this wafer, showing a ridge strip and either side of this two mesa etch areas each with a longitudinal etch area parallel to the ridge stripe and a shorter transverse etch area.

FIG. 1 is an illustration, not to scale, of an integrated prior art opto-electronic device 1 comprising two components, namely a distributed feed-back (DFB) laser diode 2 and an electro-absorption (EA) modulator 4, suitable for use as a transmitter in a high speed fibre-optic link operating at 1.55 $\mu$m.

The device 1 is grown in wafer form, on a wafer 32 mm square. The wafer has an $n^{--}$-InP substrate 6 doped to around $10^{19}$/cc, on which is grown an active layer fabricated according to known techniques for fabricating planar active lasers for a laser diode—the active layer could be a bulk region or a strained multiple quantum well (SMQW) structure. An example of an SMQW device is discussed in W. S. Ring et al, Optical Fibre Conference, Vol. 2, 1996 Technical Digest Series, Optical Society of America. The type of active layer employed is not critical to the invention.

In the present example, a 2 $\mu$m thick $n^-$-InP buffer layer 8 is grown on the substrate and doped to around $10^{18}$/cc. The laser diode has a quaternary $In_xGa_{1-x}As_{1-y}P_y$ active layer 10 which is about 100 nm to 300 nm thick, and this is topped by another buffer layer 12, here a "cladding" layer formed from $p^+$-InP. The DFB grating for the laser diode can be contained in the $n^-$-InP buffer layer or in the $p^+$-InP cap layer. The active region of the DFB laser and the EA modulator usually comprises a SMQW structure.

The output facet 9 of the modulator is anti-reflective coated for good transmission through the facet, and the back facet 11 of the laser diode may be reflectively coated or left uncoated.

The cladding or upper buffer layer 12 is grown to be about 2 $\mu$m thick, on top of which a 100 nm to 200 nm thick ternary cap layer 16 is deposited. The cap layer 16 is formed from $p^{++}$-GaInAs, highly doped to around $10^{19}$/cc, in order to provide a good low resistance ohmic contact for the electrical connection to the laser diode 2. As an alternative to a ternary cap layer, it is possible to use a quaternary InGaAsP cap layer.

Then, using well-known fabrication technology, the wafer is patterned and etched, for example by spinning, exposure and development of a photoresist layer which is then etched. First, an $SiO_2$ layer (not illustrated) is deposited in a plasma enhanced chemical vapour deposition (PECVD) process. It should, however, be noted that silicon nitride would be a suitable alternative choice to $SiO_2$. This layer is photolithographically patterned and dry etched to remove the cap layer 16 and all but 200 nm of buffer layer except along a 3 $\mu$m wide mesa or ridge stripe 14. The ridge stripe 14 therefore rises about 2 $\mu$m above the surrounding surface. Finally the PECVD oxide layer is removed (with 10:1 buffered HF) from the ridge stripe to expose again the cap layer 16.

The ridge stripe 14 has the effect of guiding an optical mode 15 along an active region 17 beneath the ridge stripe 14. The ridge stripe 14 extends from the laser diode 2 towards the EA modulator 4 through an isolation region 18. The EA modulator has a similar structure to that described for the laser diode, except that the absorption edge of the unbiased modulator is at a shorter wavelength (typically 30 nm to 100 nm shorter) than the gain maximum and the emission wavelength of the laser diode.

The isolation region 18 comprises a gap 20 etched in a process similar to that described above to remove completely the cap layer 16, and if needed the top of the upper $p^+$-InP buffer layer 12. The etching of the gap 20 stops short of a depth that would result in reflections and interfere with light guided by the active region 17 extending underneath the stripe 14.

The cap layer 16, the sides of the ridge stripe 14, and the surrounding upper buffer layer 10 are then coated with a PECVD oxide layer 22, here an $SiO_2$ dielectric passivation layer about 200 nm thick. This is patterned and etched in a similar process to that described above, to open up two contact windows on the ridge stripe 14, one 24 above the laser diode and the other 26 above the modulator. The dielectric passivation layer 22 also has the secondary purpose of protecting the side walls of the ridge stripe 14 during the remaining processing steps.

Metal is then vacuum deposited, on the device 1, using well known techniques, in two stages. First with a TiPt layer which is deposited, typically by E-beam, and is then patterned using a lift-off process, as the TiPt layer cannot be satisfactorily removed by wet etching. Then, a TiAu layer is deposited, typically by sputtering, followed by a wet etch (e.g. 50:29:56 H20:I:KI) of the Au, and a wet etch (HF) of the Ti, in photolithographically defined areas. The remaining TiAu layer forms two contacts 28,30 which cover over the contact windows 24,26 to make good ohmic contacts through the cap layer with the laser diode 2 and modulator 4. Six other metalised areas 31–36 are also formed that do not make any electrical connection but onto which pads (not shown) may be plated in order to provide physical protection to the ridge stripe 14.

After fabrication of the wafer, the prior art device 1 is inscribed and cleaved in a conventional process as described above. The prior art device 1 is about 700 $\mu$m long (i.e. in the direction of the ridge 14) and about 300 $\mu$m wide. The lengths of the laser diode 2, gap isolation region 18 and modulator 4 are, respectively about 450 $\mu$m, 50 $\mu$m and 200 $\mu$m.

Although not illustrated, the substrate 6 would be soldered onto a heat sink in a conventional manner, prior to bonding of wires onto the contact pads. Debris from the inscribing and cleaving process can potentially interfere with the wire bonds, the output from the optical facets 9,11, or with soldering to the heat sink.

Metal is then vacuum deposited, on the device 1, using well known techniques, in two states. First with a TiPt cleaving of semiconductor devices from this wafer. In these drawings, features similar to those of the prior art device 1 are labelled with reference numerals incremented by 100.

The wafer 100 has a ridge stripe 114; on either side of ridge stripe 114 are two similar massage areas 50, 52, each with an elongate longitudinal etch area 54, 55 parallel to the ridge stripe 114 and a shorter elongate transverse etch area 56, 57. The maximum width of the mesa areas 50, 52 across both the longitudinal and transverse etch areas is about 80 $\mu$m.

The wafer has a substrate 106, lower buffer layer 108, active layer 110, upper buffer (i.e., cladding) layer 112, ridge stripe 114 and cap layer 116 formed in the same manner and from the same composition as for the prior art device 1 described above. The difference in the process starts with the masking step in which the ridge stripe 114 is defined. The mask at the same time defines all of the mesa areas 50, 52 across the wafer.

Figure 3:
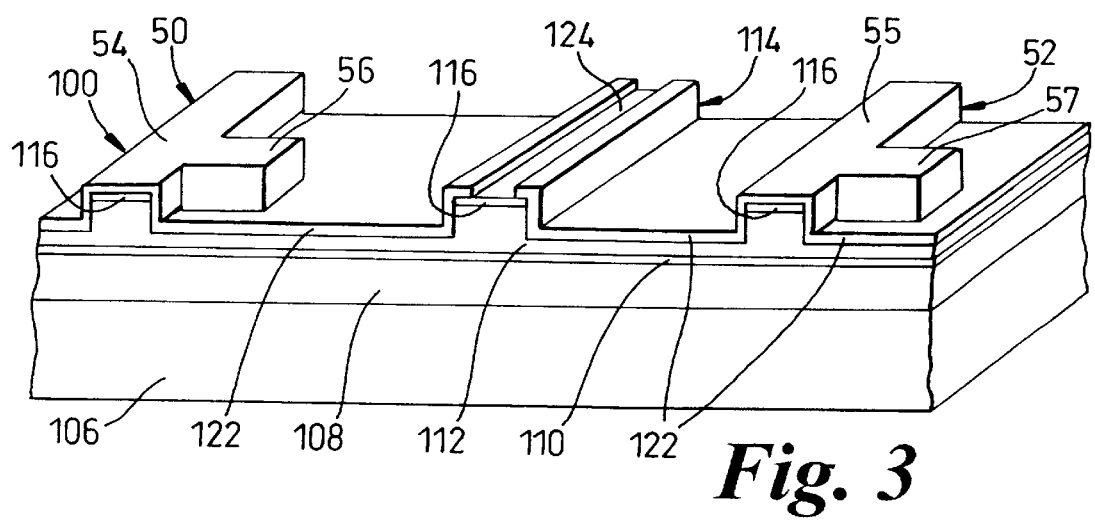

As seen in FIG. 3, an $SiO_2$ passivation layer 122 is then deposited and a contact window 124 then etched through the passivation layer 122 above the ridge stripe 114, in the same way as for the prior art device 1.

Figure 4:
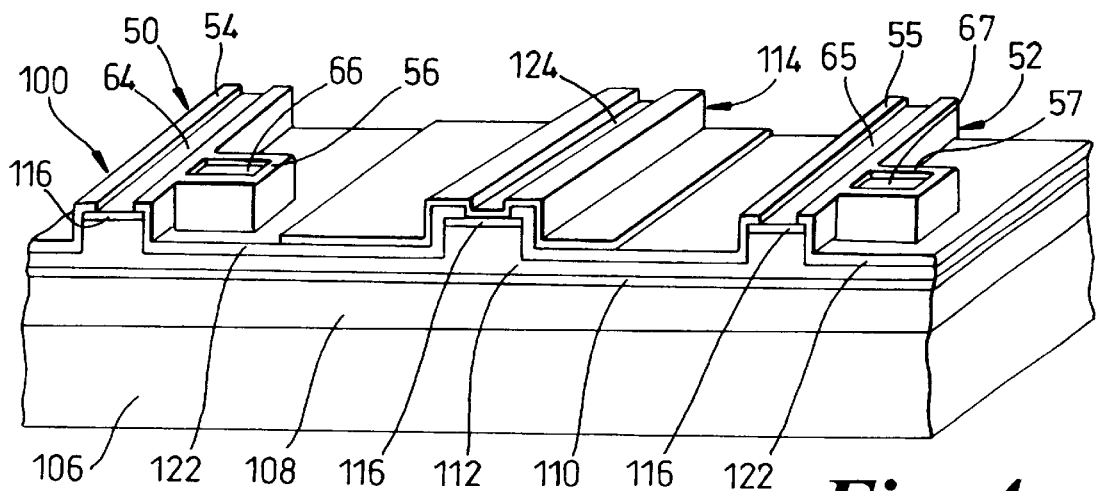

In FIG. 4, an AuTi contact area 128 has been plated over the contact window 124, and the surrounding SiO2 passivation layer 122, in the same manner as described above. Up to this point, the wafer 100 according to the invention takes advantage of the same basic process steps as for the prior art device 1.

The structure of FIG. 4 also includes longitudinal etch windows 64, 65 opened through the $SiO_2$ passivation layer 122 along a central area on either side of the axis of each of the longitudinal etch areas 54, 55. Spaced from areas S4 and S5 are transverse etch windows 66, 67 opened through passivation layer 122 along a central area on either side of the axis of each of the shorter transverse etch areas 56, 57. The width of each of the longitudinal and transverse etch windows 54–57 is about 10 $\mu$m and the length of each of the transverse etch windows 56 and 57 is about 50 $\mu$m.

These windows 64–67 are opened after the deposition of the metal layer. Otherwise, $Ar^+$ion bombardment during sputter of the TiAu layer could result in erosion of the exposed cap layer 116 in the etch windows 64–67. Such sputtering has been found to adversely affect the performance of the etching steps described below.

The etch windows are formed by first spinning onto the wafer a "Shipley" (trade mark) photoresist product code S1828. The applied resist is 2.8 $\mu$m thick and is then baked at 120° C. for 5 minutes. Using standard process steps, the photoresist is exposed, developed, post-baked and etched to define the etch pattern.

The photoresist can later be stripped also in a standard process step using a solvent such as acetone/IPA. It is known that such a photolithography process may be used to pattern a dielectric layer, the dielectric layer then being used as an etch mask for semiconductor etching. In such a case, the photoresist is stripped before the semiconductor etching. In the process being described, it is desirable to leave the photoresist on during the semiconductor etch step described below to prevent HBr used in the etch from attacking the dielectric mask.

The exposed areas of $SiO_2$ are etched in a 20° C. bath of 10:1 buffered HF. Then, the InGaAs cap layer 116 and InP cladding layer 112 are etched in a 5° C. bath of hydrobromic acid HBr: $(Br/HBr):H_2O$ mixed up as 53:(1:17):46, the etch time being 30 s for a laser device. (For a detector device, because it is necessary to etch through the InGaAs active layer and into the InP buffer, this process step can take up to 8 minutes at the same temperature.) The etch steps so far etch away both the $SiO_2$ and $p^{++}$-GaInAs cap layer 116 and about 1 $\mu$m into the $p^+$-InP cladding layer 112. Because of the intimate bond at the interface between cap layer 116 and cladding layer 112, there is essentially no undercutting of the cap layer 116 by lateral etching into the cladding layer.

A second etching step is then performed, at 20° C. for 5 minutes using 48% HBr which does not etch the cap layer 116. The second etching step opens V-grooves 163–168 and 266–268, as shown in FIGS. 5 to 8. By this stage, the etch will have gone to a depth of about 25 $\mu$m—well into the substrate, which has not yet been thinned, and is therefore still about 350 $\mu$m thick.

Referring now in greater detail to FIGS. 5 to 8, FIG. 5 is a top view of a portion of the wafer 100, drawn to scale. Shown are three similar parallel and longitudinal V-grooves 163, 164, 165 etched into three corresponding longitudinal etch windows 63, 64, 65. Next to and parallel to V-grooves 163–165 are three similar parallel ridge stripes 114, 214, 314. Between each ridge stripe and an adjacent V-groove are a number of transverse an collinear V-grooves 166, 167, 168 etched into corresponding transverse etch windows 66, 67, 68. Spaced longitudinally from transverse V-grooves 166–168 is another set of similar collinear transverse V-grooves 266, 267, 268, that are parallel to V-grooves 166–168. V-grooves 163–168 and 266–268 are therefore arranged in a grid-like pattern, defining an array of semiconductor devices.

The longitudinal V-grooves 163, 164, 165 define corresponding longitudinal cleave planes 150, 151, 152, and each set of collinear transverse V-grooves 166, 167, 168; 266, 267, 268 defines a corresponding transverse cleave plane 153; 154.

Figure 5:
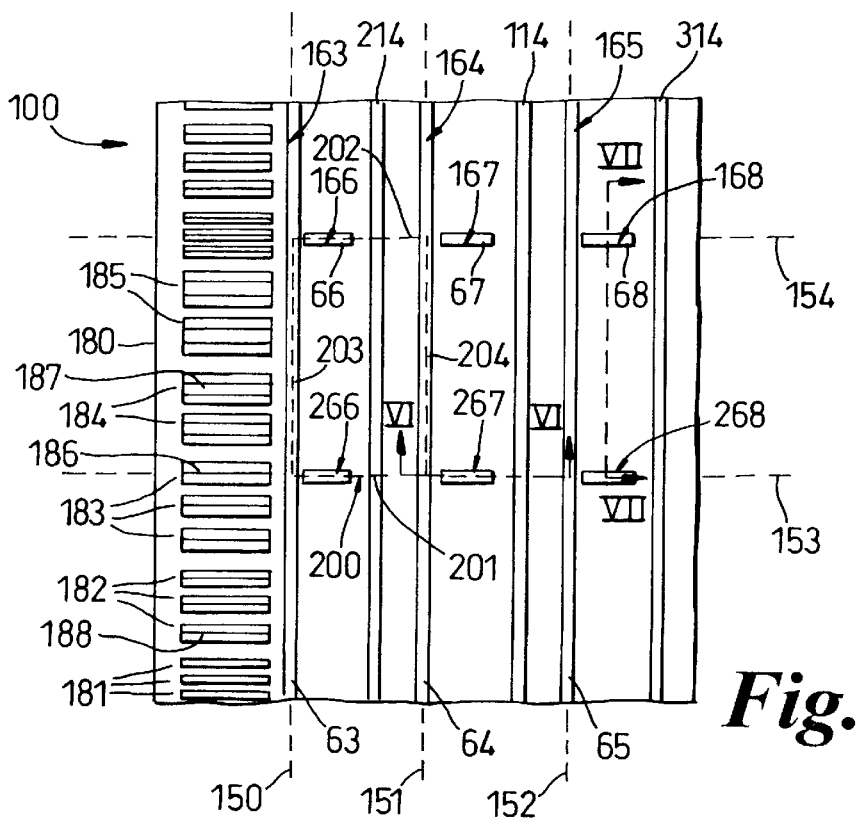
FIG. 5 is a top plan view of a larger part of the semiconductor wafer of FIGS. 2 to 4, with the ridge strip and etch areas drawn to scale.

When the device is cleaved, four V-grooves, for example 163, 164, 166, 266 define the bounds of an elongated rectangular semiconductor device 200, shown in dashed outline in FIG. 5. The device 200 includes four straight edges 201, 202; 203, 204, such that edges 201 and 202 are parallel to each other and at right angles to edges 203 and 204, which are parallel to each other.

The transverse and longitudinal grooves do not meet, but remain separated by a barrier 190 (as most clearly seen in FIG. 6) because it has been found that the etch rates at a corner defined by an intersection of the longitudinal and transverse grooves proceeds along an intermediate crystal plane at a significantly higher rate than any of the longitudinal or transverse walls in the separated grooves. This has the effect of undercutting such intersecting windows at their junction, and this has the undesirable effect of degrading slightly the definition of the transverse cleaves and increasing the potential for producing debris during cleaving owing to break off of the overhang. In addition, the etch rate at the corner can be so high that grooves fail to form properly. The provision of a gap between the longitudinal and transverse etch areas, and the consequent feature of the barrier 190, FIG. 6, separating the grooves, is therefore an important feature of the invention.

Figure 6:
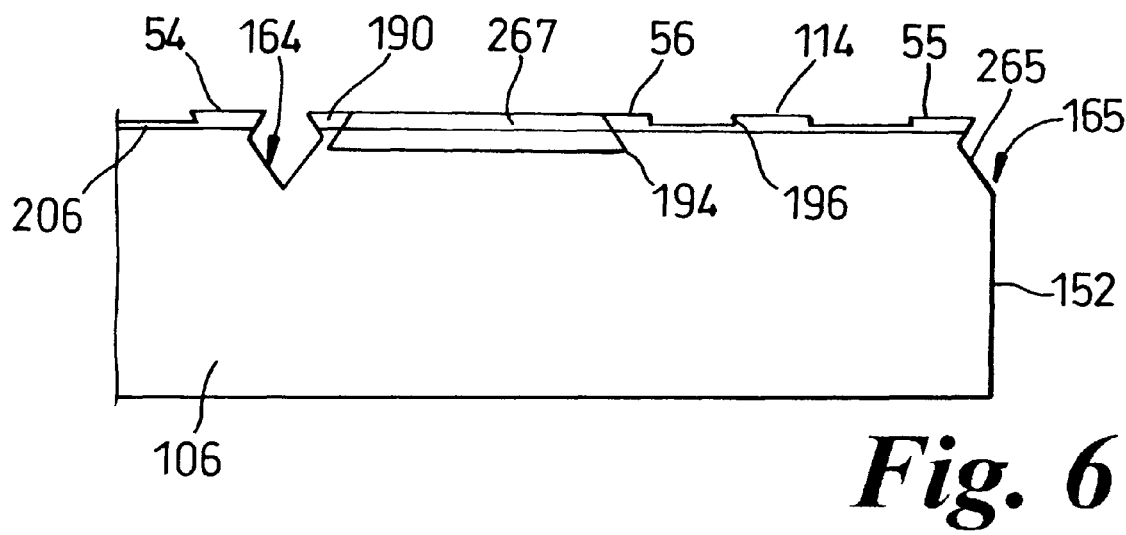
FIG. 6 is a cross-section through part of the wafer of FIG. 5 taken along line VI—VI, drawn to scale.
Figure 7:
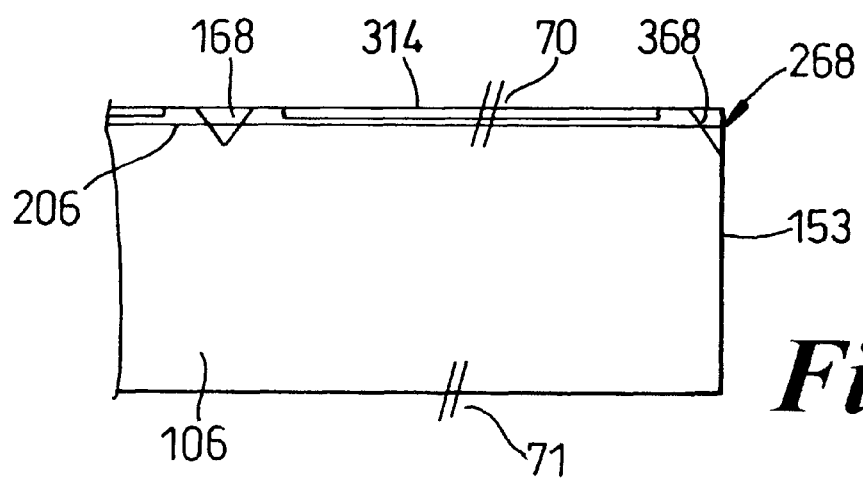
FIG. 7 is a cross-section through part of the wafer of FIG. 5 taken along line VII—VII, drawn to scale.

FIGS. 6 and 7 are illustrations including longitudinal and transverse V-grooves 164, 165, 168 and 268 in cross section. FIGS. 6 and 7 are also to scale, apart from the horizontal cuts 70, 71 in FIG. 7. As can be seen from the illustrations, each of the transverse and longitudinal V-grooves 164, 165, 168 and 268 extends below an upper boundary 206 of the substrate 106, but the transverse grooves have different cross-sectional profiles from the longitudinal grooves. The transverse V-grooves e.g. 168, 267, 268 have straight walls or sides that taper inwardly to a point at the vertex of the "V", and the longitudinal V-grooves have a base with the same V-shape but an upper part with an inverted V-shape, truncated by the width of the etch windows. The difference is due to the orientation of the crystal lattice of the substrate 106 and layers grown above this. In the present example, the crystal structure of the InP substrate is a face-centered cubic (fcc), and the orientation with respect to the axis of the ridge stripe 14 is 1,0,0±1.5°.

As the etching of the cladding 112, active layer 110, lower buffer layer 108 and substrate 106 progresses, the bottom of the etch will have a generally flat surface until the tapering walls meet at the vertex of the V-groove. In the case of the transverse grooves, the depth is naturally self-limiting once the vertex is reached, and the etch proceeds no further. The depth of the transverse grooves is therefore determined by the width of the transverse etch windows.

In the case of the longitudinal V-grooves, because the etch also proceeds to etch away two crystal planes along each wall of the groove, the depth is not naturally self-limiting, and will proceed all the way through the substrate 106 if left unchecked. Therefore, it is necessary to control the etching process to ensure that the longitudinal V-grooves are etched to an optimal depth both in terms of maintaining a minimum robustness for handling purposes, and to permit reliable cleaving. In the present example, it has been found that a depth of about 25 $\mu$m is satisfactory when the thickness of the substrate after thinning is about 80 $\mu$m.

The etching rate will, of course, vary sensitively dependent upon variables such as temperature or acid concentration. Therefore, along one edge 180 of the wafer 100 are provided a number of transverse control etch areas 181, 182, 183, 184, 185 of different widths. Each of these will naturally etch to a different depth. In the present example, three side etch areas 183 are of a width such that when this has just etched to its full depth, the transverse V-grooves 166, 167, 168, 266, 267, 268 will also have been etched to the correct depth. In processing, the wafer is removed from the etch bath at the appropriate time, and then inspected under a microscope by an operator. The operator checks the three side etch areas 183, to see if a vertex 186 is visible centered in the area, as shown in FIG. 5. If so, the operator also checks the adjacent wider pair of etch areas 184 to see if a base 188 is visible, indicating that this V-groove has not yet been etched to its natural, deeper, depth.

If the three side etch areas 183 have not been etched fully, the operator checks the adjacent narrower three etch areas 182 to see if these have yet etched to show a vertex 188. If further etching is needed, the operator places the wafer back in the etch batch for an additional 120 s, and then checks again.

The wafer is then thinned to a thickness of about 70 $\mu$m to 100 $\mu$m in a standard way, in order to assist with cleaving.

Ti/Au metal is then deposited by sputtering on the rear surface of the wafer, enabling the device to be soldered onto a heat sink.

The wafer is then cleaved, first transversely into bars 350 $\mu$m wide, and then each bar is cleaved into individual devices 200 $\mu$m wide.

FIG. 6 includes one longitudinal cleave 152 that has been guided by a longitudinal cleave 152, one side of which has a groove wall 265. FIG. 7 includes one transverse cleave 153 that has been guided by a groove 268, one side of which has a groove wall 368. Note in FIG. 6, that there is a separation of about 10 $\mu$m between an end 194 of the transverse cleave closest the ridge stripe 114, and the nearest edge 196 of this stripe. The optical performance of the device is therefore unaffected by the relatively deep V-grooves.

The process described above is suitable for other types of compound semiconductor device, for example buried heterostructure laser diodes, ridge waveguide type lasers, pump lasers, edge emitting light emitting diodes, edge photodetectors, surface emitting laser and light emitting diodes, and top-entry photodetectors. With suitable etchants, the process can be adapted for GaAs/AlGaAs devices, as well.

The process described above substantially eliminates any debris associated with the cleaving process, thereby allowing a higher yield in the manufacturing process. The time taken to cleave a wafer is also reduced significantly, resulting in a higher through put. A relatively expensive item of plant, the inscribing machine, is also eliminated, allowing further savings in the manufacturing cost of a semiconductor device.

What is claimed is:

1. A semiconductor device cleaved from a wafer comprising a substrate and grown upon the substrate a cap layer and a cladding layer, the cap and cladding layers having an intimate bond therebetween, the cleaves thereby defining two pairs of parallel edges of the device, wherein each of the cleaves has been guided by a groove etched firstly through the cap layer and partially through the cladding layer and subsequently etched through the remaining cladding layer and partly into the substrate.

2. A semiconductor device as claimed in claim 1, in which a groove has a wall that extends at least partly along an edge of the device.

3. A semiconductor device as claimed in claim 1, in which a groove has a wall that extends fully along an edge of the device.

4. A semiconductor device as claimed in claim 1, in which a first pair of parallel edges is at right angles to a second pair of parallel edges, in which each one of the first pair of edges has a groove wall extending fully therealong, and each one of the second pair of edges has a groove wall extending only partly therealong.

5. A semiconductor device as claimed in claim 2, in which the device has an active optical region, the optical region extending to an edge of the device, there being no groove wall in the vicinity of the optical region.

6. A semiconductor device as claimed in claim 4, in which the device has an active optical region, the optical region extending to an edge of the device, there being no groove wall in the vicinity of the optical region.

7. A semiconductor device as claimed in claim 2, in which two adjacent edges each has a groove wall that extends at least partly along an edge of the device, at least one of the groove walls not extending to a corner defined by the junction of the adjacent edges.

8. A semiconductor device as claimed in claim 4, in which two adjacent edges each has a groove wall that extends at least partly along an edge of the device, at least one of the groove walls not extending to a corner defined by the junction of the adjacent edges.

9. A semiconductor device as claimed in claim 5, in which two adjacent edges each has a groove wall that extends at least partly along an edge of the device, at least one of the groove walls not extending to a corner defined by the junction of the adjacent edges.

10. A semiconductor wafer comprising a substrate and grown upon the substrate a cap layer and a cladding layer or, the cap and cladding layers having an intimate bond therebetween, and grooves etched firstly through the cap layer and partially through the cladding layer and subsequently etched through the remaining cladding layer and partly into the substrate, wherein the grooves are arranged in a grid-like pattern to define cleave planes and hence edges of an array of semiconductor devices.

11. A semiconductor wafer as claimed in claim 10, in which a groove has a wall that extends at least partly along an edge of a device.

12. A semiconductor wafer as claimed in claim 10 in which a groove has a wall that extends fully along an edge of a device.

13. A semiconductor wafer as claimed in claim 10, in which a device has a first pair and a second pair of parallel edges, each pair being at right angles to the other pair, in which each one of the first pair of edges has a groove extending fully therealong, and each one of the second pair of edges has a groove extending only partly therealong.

14. A semiconductor wafer as claimed in claim 11, having an active optical region, the optical region extending to an edge of a device, in which there is no groove in the vicinity of the optical region.

15. A semiconductor wafer as claimed in claim 13, having an active optical region, the optical region extending to an edge of a device, in which there is no groove in the vicinity of the optical region.

16. A semiconductor wafer as claimed in claim 11, in which two adjacent edges each have a groove that extends at least partly along an edge of a device, at least one of the grooves not extending to a corner defined by the junction of the adjacent edges.

17. A semiconductor wafer as claimed in claim 14, in which two adjacent edges each have a groove that extends at least partly along an edge of a device, at least one of the grooves not extending to a corner defined by the junction of the adjacent edges.

18. A semiconductor wafer as claimed in claim 10, in which the wafer has a number of control etch areas of different widths that may be inspected to verify etch depth of the grooves.

19. A manufacturing process for a semiconductor wafer, comprising the steps of:
 i) forming a semiconductor substrate;
 ii) growing upon the substrate one or more layers;
 iii) etching grooves through the grown layers and partly into the substrate, wherein the grooves arranged in a grid-like pattern define cleave planes and hence define edges of an array of semiconductor devices.

20. A manufacturing process for a semiconductor device, comprising the steps of:
 i) forming a semiconductor substrate;
 ii) growing upon the substrate one or more layers;
 iii) etching grooves through the grown layers and partly into the substrate, wherein the grooves arranged in a grid-like pattern define cleave planes and hence define edges of an array of semiconductor devices; and
 iv) cleaving the wafer along the grid-like pattern of grooves to separate the devices.

21. A cleaved semiconductor structure comprising a substrate carrying a semiconductor device, the structure including first and second parallel sides as well as third and fourth parallel sides at right angles to the first and second parallel sides, each of the first and second parallel sides including a first etched edge tapering outwardly from a top surface of the structure to a first cleaved edge at right angles to the top surface, each of the third and fourth parallel sides including second and third etched edges and a second cleaved edge, the second etched edge tapering inwardly from the top surface to an intersection with the third etched edge, the third etched edge tapering outwardly from the intersection to a second cleaved edge.

22. The structure of claim 21 wherein the first etched edges extend only part way between the third and fourth sides, the remaining portion of the first and second sides being cleaved.

23. The structure of claim 22 wherein the second and third etched edges extend completely between the first and second sides.

24. The structure of claim 23 wherein some portions of the substrate carry a cladding layer which is intimately bonded with a cap layer, some portions of the etched edges extending from the top of the wafer through the cap and cladding layers into the substrate, other portions of the etched edges intersecting other portions of the cleaved edges between the substrate and the top surface.

25. The structure of claim 21 wherein the second and third etched edges extend completely between the first and second sides.

26. The structure of claim 21 wherein the substrate carries a cladding layer which is intimately bonded with a cap layer, the etched edges extending from the top of the wafer through the cap and cladding layers into the substrate, the etched edges intersecting the cleaved edges in the substrate.

27. A cleaved semiconductor structure comprising a substrate carrying a cladding layer which is intimately bonded to a cap layer, the structure including first and second parallel sides as well as third and fourth parallel sides at right angles to the first and second parallel sides, each of the first and second parallel sides including at least one etched edge and a cleaved edge, the at least one etched edge extending between the top of the cap layer through the cladding layer into the substrate to an intersection in the substrate with the cleaved edge.

28. The structure of claim 27 wherein the etched edges of the first and second sides extend only part way between the third and fourth sides, the remaining portion of the first and second sides being cleaved.

29. The structure of claim 28 wherein the etched edges of the third and fourth sides extend completely between the first and second sides.

30. The structure of claim 27 wherein the etched edges of the third and fourth sides extend completely between the first and second sides.

31. A semiconductor wafer adapted to be cleaved comprising a substrate carrying layers for forming semiconductor devices, first parallel etched grooves extending inwardly of the wafer from one face of the wafer, second parallel etched grooves extending inwardly of the wafer from said face, the first and second etched grooves respectively extending in first and second directions at right angles to each other, the second grooves extending continuously between at least three of the first grooves, the first grooves being discontinuous so as not to intersect the second grooves, each of the first grooves including first and second etched surfaces that taper from a top face of the wafer toward each other and intersect in the semiconductor structure, each of the second grooves including first and second sides, at least one side of each of the second grooves including third and fourth etched surfaces, the third etched surface tapering outwardly from said face into the interior of the wafer to an intersection with the fourth etched surface, the fourth etched surface extending inwardly from the intersection with the third etched surface farther into the interior of the wafer to an intersection with the second side.

32. The structure of claim 31 wherein the second side is a mirror image of the first side.

33. The structure of claim 31 wherein the second side includes fifth and sixth etched surfaces, the fifth etched surface tapering outwardly from said face into the interior of the wafer to an intersection with the sixth etched surface, the sixth etched surface extending inwardly from the intersection with the fifth etched surface farther into the interior of the wafer to an intersection with the second side.

34. The structure of claim 31 wherein the substrate carries a cladding layer which is intimately bonded with a cap layer, the etched grooves extending from the top of the wafer through the cap and cladding layers into the substrate, the sides of the etched grooves intersecting in the substrate.

35. The cleaved semiconductor structure of claim 1 wherein the structure includes first and second parallel sides as well as third and fourth parallel sides at right angles to the first and second parallel sides, each of the first and second parallel sides including a first etched edge tapering outwardly from a top surface of the structure to a first cleaved edge at right angles to the top surface, each of the third and fourth parallel sides including second and third etched edges and a second cleaved edge, the second etched edge tapering inwardly from the top surface to an intersection with the third etched edge, the third etched edge tapering outwardly from the intersection to a second cleaved edge.

36. The cleaved semiconductor structure of claim 10 wherein the structure includes first and second parallel sides as well as third and fourth parallel sides at right angles to the first and second parallel sides, each of the first and second parallel sides including a first etched edge tapering outwardly from a top surface of the structure to a first cleaved edge at right angles to the top surface, each of the third and fourth parallel sides including second and third etched edges and a second cleaved edge, the second etched edge tapering inwardly from the top surface to an intersection with the third etched edge, the third etched edge tapering outwardly from the intersection to a second cleaved edge.

* * * * *

UNITED STATES PATENT AND TRADEMARK OFFICE
CERTIFICATE OF CORRECTION

PATENT NO. : 6,335,559 B1
DATED : January 1, 2002
INVENTOR(S) : Paul Marshall Charles It is certified that error appears in the above-identified patent and that said Letters Patent is hereby corrected as shown below:

Column 8,
Lines 51 and 55, after "wall in" delete "the" add -- a --
Lines 59 and 64, after "by" delete "the" add -- a --

Column 9,
Lines 2, 36 and 41, after "by" delete "the" add -- a --
Lines 27 and 31, after "groove in" delete "the" add -- a --

Signed and Sealed this

Fifth Day of October, 2004

JON W. DUDAS
*Director of the United States Patent and Trademark Office*